(12) United States Patent     (10) Patent No.:   US 12,690,252 B2

Hill     (45) Date of Patent:    Jul. 21, 2026

(54) TRANSISTOR GATE STRUCTURE WITH INSULATING LAYER AND METHOD OF FABRICATION THEREFOR

(71) Applicant: NXP USA, Inc., Austin, TX (US)

(72) Inventor: Darrell Glenn Hill, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 924 days.

(21) Appl. No.: 17/646,305

(22) Filed: Dec. 29, 2021

(65) Prior Publication Data

US 2023/0207640 A1    Jun. 29, 2023

(51) Int. Cl.
| | |
|---|---|
| *H10D 64/00* | (2025.01) |
| *H10D 30/01* | (2025.01) |
| *H10D 30/47* | (2025.01) |
| *H10D 64/01* | (2025.01) |
| *H10D 64/68* | (2025.01) |

(52) U.S. Cl.
CPC ......... *H10D 64/111* (2025.01); *H10D 30/015* (2025.01); *H10D 30/475* (2025.01); *H10D 30/4755* (2025.01); *H10D 64/01* (2025.01); *H10D 64/685* (2025.01); *H10D 64/691* (2025.01); *H10D 64/693* (2025.01)

(58) Field of Classification Search
CPC ... H01L 29/402; H01L 29/518; H01L 29/778; H01L 29/4312; H01L 29/6647; H01L 29/66848; H10D 64/111; H10D 64/01; H10D 30/015; H10D 30/475; H10D 64/691
USPC ....................................................... 257/194
See application file for complete search history.

(56) References Cited

U.S. PATENT DOCUMENTS

| | | | | |
|---|---|---|---|---|
| 4,200,474 | A | 4/1980 | Morris | |
| 4,810,666 | A * | 3/1989 | Taji ......................... | H10D 30/60 |
| | | | | 257/E21.507 |
| 5,585,293 | A * | 12/1996 | Sharma .................. | H10B 41/00 |
| | | | | 257/318 |
| 6,884,739 | B2 | 4/2005 | Ahn et al. | |
| 7,858,460 | B2 * | 12/2010 | Ring ....................... | H01L 29/24 |
| | | | | 257/E21.177 |

(Continued)

FOREIGN PATENT DOCUMENTS

| | | |
|---|---|---|
| EP | 1003206 B1 | 5/2010 |
| JP | 2008277420 A * | 11/2008 |

OTHER PUBLICATIONS

Burns G.P. et al: "The plasma oxidation of titanium thin films to form dielectric layers"; Journal of Applied Physics 66, 2320; 6 pages (Aug. 17, 1998).

*Primary Examiner* — Toan Ton

(74) *Attorney, Agent, or Firm* — Sherry W. Gourlay

(57) ABSTRACT

A transistor device includes a semiconductor substrate and a gate structure formed at the upper surface of the substrate. The gate structure includes a metal gate electrode and a gate insulating layer overlying the metal gate electrode, where edges of the gate insulating layer correspond to edges of the metal gate electrode. The transistor device also includes a first dielectric layer formed over the gate structure, and a first interconnect metal layer formed over the first dielectric layer. A portion of the first interconnect metal layer forms a field plate proximate to the gate structure, and a portion of the gate insulating layer and a portion of the first dielectric layer are present between the gate electrode and the field plate.

16 Claims, 6 Drawing Sheets

(56) References Cited

U.S. PATENT DOCUMENTS

| | | | | |
|---|---|---|---|---|
| 8,212,290 | B2* | 7/2012 | Heikman | H01L 29/66462 |
| | | | | 257/195 |
| 8,692,292 | B2* | 4/2014 | Umeda | H10D 30/475 |
| | | | | 257/194 |
| 9,178,016 | B2* | 11/2015 | Strassburg | H01L 29/0638 |
| 9,379,229 | B2* | 6/2016 | Ohki | H03F 3/19 |
| 9,425,267 | B2* | 8/2016 | Huang | H01L 29/66916 |
| 9,799,760 | B2* | 10/2017 | Green | H01L 29/0615 |
| 9,847,411 | B2* | 12/2017 | Sriram | H01L 29/402 |
| 9,911,817 | B2* | 3/2018 | Xia | H01L 29/404 |
| 2005/0253168 | A1* | 11/2005 | Wu | H01L 29/812 |
| | | | | 257/E29.253 |
| 2006/0011915 | A1* | 1/2006 | Saito | H01L 29/1066 |
| | | | | 257/E29.252 |
| 2006/0202272 | A1* | 9/2006 | Wu | H01L 29/7787 |
| | | | | 257/E29.253 |
| 2007/0235775 | A1* | 10/2007 | Wu | H01L 29/7787 |
| | | | | 257/E29.127 |
| 2008/0035934 | A1* | 2/2008 | Sheppard | H01L 21/3185 |
| | | | | 257/E29.1 |
| 2008/0230786 | A1* | 9/2008 | Heikman | H10D 64/111 |
| | | | | 257/E29.253 |
| 2009/0140262 | A1* | 6/2009 | Ohki | H01L 23/291 |
| | | | | 257/E21.403 |
| 2010/0044806 | A1* | 2/2010 | Hou | H10D 64/685 |
| | | | | 257/412 |
| 2011/0049526 | A1* | 3/2011 | Chu | H10D 64/111 |
| | | | | 257/E29.089 |
| 2012/0217507 | A1* | 8/2012 | Ohki | H10D 30/015 |
| | | | | 257/E29.246 |
| 2012/0217544 | A1* | 8/2012 | Ohki | H01L 29/66462 |
| | | | | 257/E29.246 |
| 2013/0256755 | A1* | 10/2013 | Kurachi | H10D 64/111 |
| | | | | 257/194 |
| 2013/0341678 | A1* | 12/2013 | Green | H01L 29/0638 |
| | | | | 257/E29.317 |
| 2014/0001640 | A1* | 1/2014 | Nishizawa | H10D 64/23 |
| | | | | 257/773 |
| 2014/0061659 | A1* | 3/2014 | Teplik | H01L 29/402 |
| | | | | 257/E21.403 |
| 2014/0246760 | A1* | 9/2014 | Strassburg | H01L 29/66431 |
| | | | | 257/637 |
| 2015/0144953 | A1* | 5/2015 | Hill | H01L 29/7787 |
| | | | | 438/172 |
| 2015/0279722 | A1* | 10/2015 | Kikuchi | H01L 29/402 |
| | | | | 257/192 |
| 2015/0294921 | A1* | 10/2015 | Viswanathan | H01L 21/28 |
| | | | | 257/256 |
| 2017/0317202 | A1* | 11/2017 | Green | H01L 23/3171 |
| 2019/0157440 | A1* | 5/2019 | Green | H01L 29/7787 |
| 2020/0176389 | A1* | 6/2020 | Huang | H01L 29/42316 |
| 2021/0184005 | A1* | 6/2021 | Liu | H10D 30/603 |
| 2021/0325336 | A1* | 10/2021 | Ukai | H10K 85/615 |

* cited by examiner

TRANSISTOR GATE STRUCTURE WITH INSULATING LAYER AND METHOD OF FABRICATION THEREFOR

TECHNICAL FIELD

Embodiments of the subject matter described herein relate generally to transistor devices, and more particularly to gate structures of semiconductor power transistors.

BACKGROUND

Power field effect transistor (FET) devices find application in a wide variety of electronic components and systems. Various advances have been made over the years to improve gain, efficiency, and other characteristics of power FETs that are used to provide amplification in radio frequency (RF) communication systems. For example, one such advance is to include a source-connected field plate in proximity to the gate of a power FET, which may facilitate an increased breakdown voltage and a reduced high-field trapping effect. However, parasitic capacitance between the gate metal and the overlying field plate may degrade the device's gain and unity current gain frequency ($f_T$). Accordingly, transistor structures are desired that achieve the benefits of a field plate while reducing undesirable performance degradation.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

As discussed above, in a power FET device, undesirably large parasitic capacitance between the gate metal and overlying field plate metal may degrade the performance of the device (e.g., gain and $f_T$). Increasing the thickness of the dielectric material between the gate and field plate may help to reduce this parasitic capacitance. However, this dielectric material cannot be made arbitrarily thicker because overly-thick dielectric material may undesirably interfere with the efficacy of the field plate.

Various embodiments of the inventive subject matter address the above challenges by providing a gate structure that is configured to decrease the parasitic capacitance between the gate metal and the field plate, or the parasitic gate-to-source capacitance $C_{GS}$, without interfering with the efficacy of the field plate. According to various embodiments, a top portion of a gate metal stack comprises a material which is insulating or can be rendered insulating. In some embodiments, the top layer of the gate metal stack may be converted from a conducting or semiconductor material into an insulating layer (e.g., via an oxidation, nitridation, or other suitable process). In other embodiments, a final layer deposited on or as part of the gate metal stack may include an insulating material layer (e.g., silicon dioxide, silicon nitride, silicon monoxide, boron oxide, boron nitride or another suitable insulator).

Figure 1:
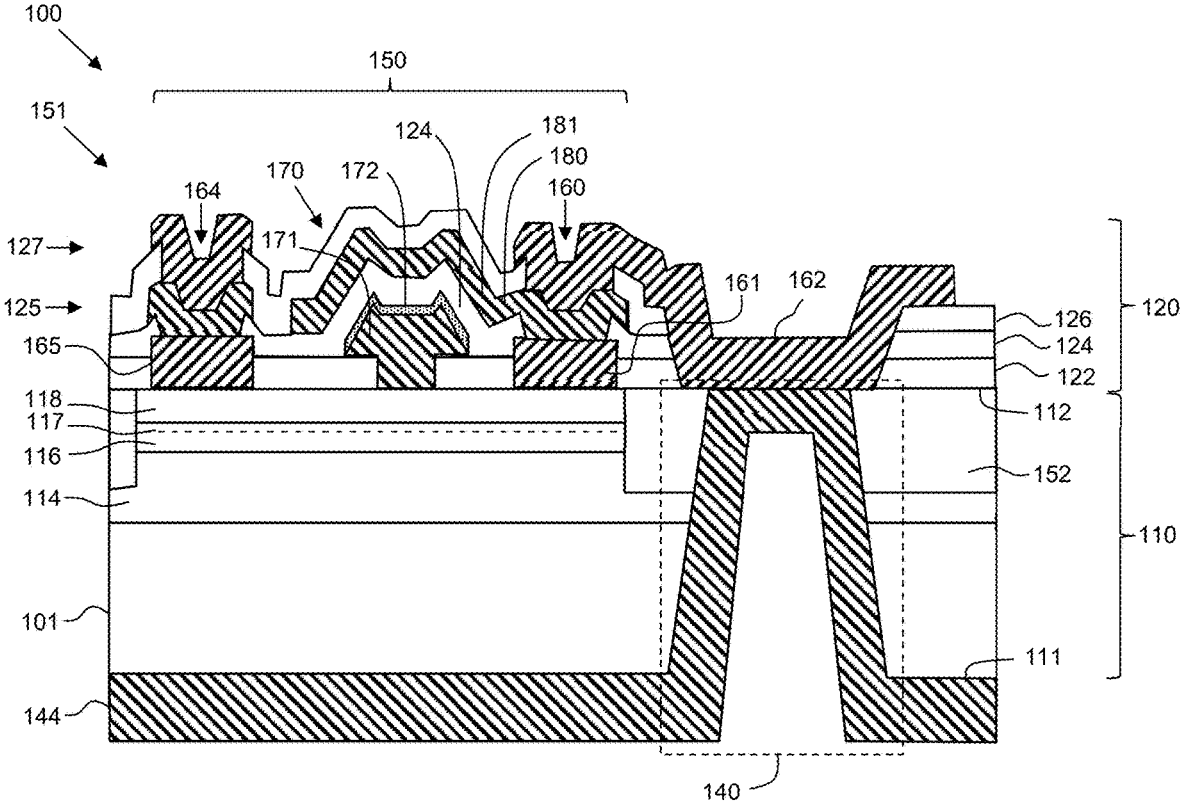
FIG. 1 is a cross sectional side view of a transistor device in accordance with an embodiment.

FIG. 1 depicts a cross sectional side view of a transistor device 100 in accordance with an embodiment. Embodiments of the device 100 may address various shortcomings of conventional devices. Specifically, and as described in more detail later, device 100 includes a gate structure 170 that includes a conductive gate electrode 171 and an overlying gate insulating layer 172. The gate insulating layer 172 may significantly reduce parasitic capacitance between the gate electrode 171 and an overlying field plate 180, and thus may improve the gain and $f_T$ of the device 100.

In an embodiment, transistor device 100 includes a semiconductor die comprising a base semiconductor substrate 110 and an overlying build-up structure 120. The substrate 110 is defined by an upper substrate surface 112 and a lower substrate surface 111, along with sidewalls that extend between the lower and upper substrate surfaces 111, 112. A plurality of additional electrical structures, patterned conductive layers, and dielectric layers are included in the build-up structure 120, which is connected to and overlies the upper surface 112 of the substrate 110.

In an embodiment, an active region 150 is defined within a portion of the substrate 110 and an overlying portion of the build-up structure 120. One or more isolation regions 152 may be defined within the substrate 110 at the upper surface 112 in order to define the active region 150.

In an embodiment, the semiconductor substrate 110 may include a host semiconductor substrate 101 and a plurality of layers overlying the host substrate 102. According to an embodiment, the plurality of layers overlying the host substrate 101 includes a buffer layer 114, a channel layer 116, and a barrier layer 118, all of which are described in more detail later in conjunction with FIG. 3.

In an embodiment, the build-up structure 120 is formed on and over the upper surface 112 of the substrate 110 and may include various electrical structures (e.g., gate structure 170, source and drain contacts 160, 164), a plurality of dielectric layers (e.g., dielectric layers 122, 124, 126), and a plurality of patterned conductive layers (e.g., interconnect metal layers 125, 127).

A transistor 151 is formed in the active region 150 of the device 100. In various embodiments, the transistor 151 is a field effect transistor (FET), which includes a gate structure 170, a source contact 160 (or source electrode 161) proximate to a first side of the gate structure 170, and a drain contact 164 (or drain electrode 165) proximate to a second side of the gate structure 170, all of which are formed in the build-up structure 120 overlying the substrate 110. In a more particular embodiment, the transistor 151 is a high electron mobility transistor (HEMT), although the transistor 151 may be another type of transistor, as well.

The source and drain contacts 160, 164 (also referred to as first and second current-carrying electrodes) are formed on the upper surface 112 of the substrate 110. As will be described in more detail below in conjunction with FIGS. 3-6, each of the source and drain contacts 160, 164 includes a composite structure formed from multiple conductive structures. In any event, each of the source and drain contacts 160, 164 includes a source or drain electrode 161, 165, respectfully, which make contact with the upper surface 112 of the substrate 110. In some embodiments, the source and drain electrodes 161, 165 make ohmic contact with the substrate 110. More specifically, source electrode 161 and drain electrode 165 are formed laterally adjacent each other, and both of these electrodes 161, 165 extend through a first dielectric layer 122 of the build-up structure 120 (e.g., a passivation layer) to make contact with the upper surface 112 of the substrate 110. In addition, the source and drain electrodes 161, 165 are electrically coupled to opposite ends of a channel 117, which is present within the substrate 110. The source electrode 161 and source contact 160 also are electrically coupled to a through substrate via (TSV) 140 (discussed below) through patterned portions of one or more of the interconnect metal layers 125, 127 of the build-up structure 120. The drain electrode 165 and drain contact 164 are electrically coupled to an output (not shown) of the device 100.

The TSV 140 extends from the lower surface 111 of the substrate 110 to and through the upper surface 112 of the substrate 110, extending through one of the above-mentioned inactive regions 152. A back metal layer 144, which is deposited on the lower surface 111 of the substrate 110 and onto the interior surfaces of TSV 140, is physically and electrically coupled to a portion of a conductive layer 127, which in turn is electrically coupled to the source contact 161. Accordingly, the source contact 161 is electrically coupled to the back metal layer 144 through the portion of the conductive layer 127. The back metal layer 144 may include an adhesion layer that contacts the lower substrate surface 111 of the substrate 110, and a primary conductive layer that contacts the adhesion layer.

The gate structure 170, which is also electrically coupled to the channel 117, is located between the source contact 160 and the drain contact 164. According to an embodiment, the gate structure 170 includes a metallic gate electrode 171 (i.e. "control electrode") and an overlying insulating material layer 172. According to an embodiment, the gate electrode 171 extends through the first dielectric layer 122 of the build-up structure 120 to contact the upper surface 112 of the substrate 110 between the source and drain electrodes 161, 165. In some embodiments, the gate electrode 171 includes a Schottky contact connected to the substrate 110. As will be described in more detail later, the gate insulating layer 172 overlies the gate electrode 171. In some embodiments, the gate insulating layer 172 is a material layer that has been converted from a conducting material (e.g., the upper portion of the conductive material of the gate electrode 171) into an insulating layer (e.g., via an oxidation, nitridation, or other suitable process). In other embodiments, the gate insulating layer 172 may include a layer of insulating material that is deposited on the gate electrode 171 as part of forming the gate structure 170. However it is formed, and according to various embodiments, the gate insulating layer 172 may be formed from one or more dielectric materials in a group consisting of silicon dioxide, silicon nitride, silicon monoxide, silicon oxynitride, boron oxide, boron nitride, boron oxynitride, titanium oxide, aluminum oxide, and/or other suitable materials.

The build-up structure 120 includes a first dielectric layer 122 deposited on the upper surface 112 of the substrate 110. As mentioned above, each of the source and drain electrodes 161, 165 and the gate electrode 171 extend through openings in the first dielectric layer 122 to contact the upper surface 112 of the substrate 110 at various points above the channel 117. In an embodiment, the first dielectric layer 122 (and other dielectric layers 124, 126, discussed below) may have a thickness in a range of about 100 angstroms to about 10,000 angstroms, although other thickness values may be used. In other embodiments, each of the dielectric layers 122, 124, 126 may have thickness values in the range of about 500 angstroms to about 5,000 angstroms, although other thickness values may be used. Further, according to an embodiment, each of the dielectric layers 122, 124, 126 are formed from one or more dielectric materials selected from a group consisting of silicon nitride, silicon oxide, silicon oxynitride, and/or other suitable materials.

A second dielectric layer 124 of the build-up structure 120 is deposited over the first dielectric layer 122, the source and drain electrodes 161, 165, and the gate structure 170. A first interconnect metal layer 125 is deposited over the second dielectric layer 124. Separate portions of the first interconnect metal layer 125 make contact with each of the source electrode 161, the drain electrode 165, and the gate structure 170 through openings in the second dielectric layer 124.

One of those portions 180 of the first interconnect metal layer 125 contacts the source electrode 161. A conductive field plate 181 is defined by a part of that first interconnect metal layer portion 180 that extends between the source electrode 161 and the gate structure 170. Portions or "straps" of the conductive field plate 181 may extend over the gate structure 170, as shown in the cross-sectional view of FIG. 1. In other locations along the field plate 181, the field plate 181 may not extend over the gate structure 170.

A third dielectric layer 126 of the build-up structure 120 is deposited over the first interconnect metal layer 125. A second interconnect metal layer 127 is deposited over the third dielectric layer 126. Separate portions of the second interconnect metal layer 127 are electrically coupled to each of the source electrode 161, the drain electrode 165, and the gate structure 170 through openings in the third dielectric layer 126. One of those portions 162 of the second interconnect metal layer 127 is electrically coupled to and extends from the source electrode 161 to the portion of the upper surface 112 of the substrate 110 over the isolation region 152. The portion of the back metal layer 144 deposited at the innermost end of the TSV 140 is physically and electrically coupled to the portion 162 of the second interconnect metal layer 127, thus electrically coupling the source electrode 161 and the field plate 181 to the back metal layer 144.

Figure 2:
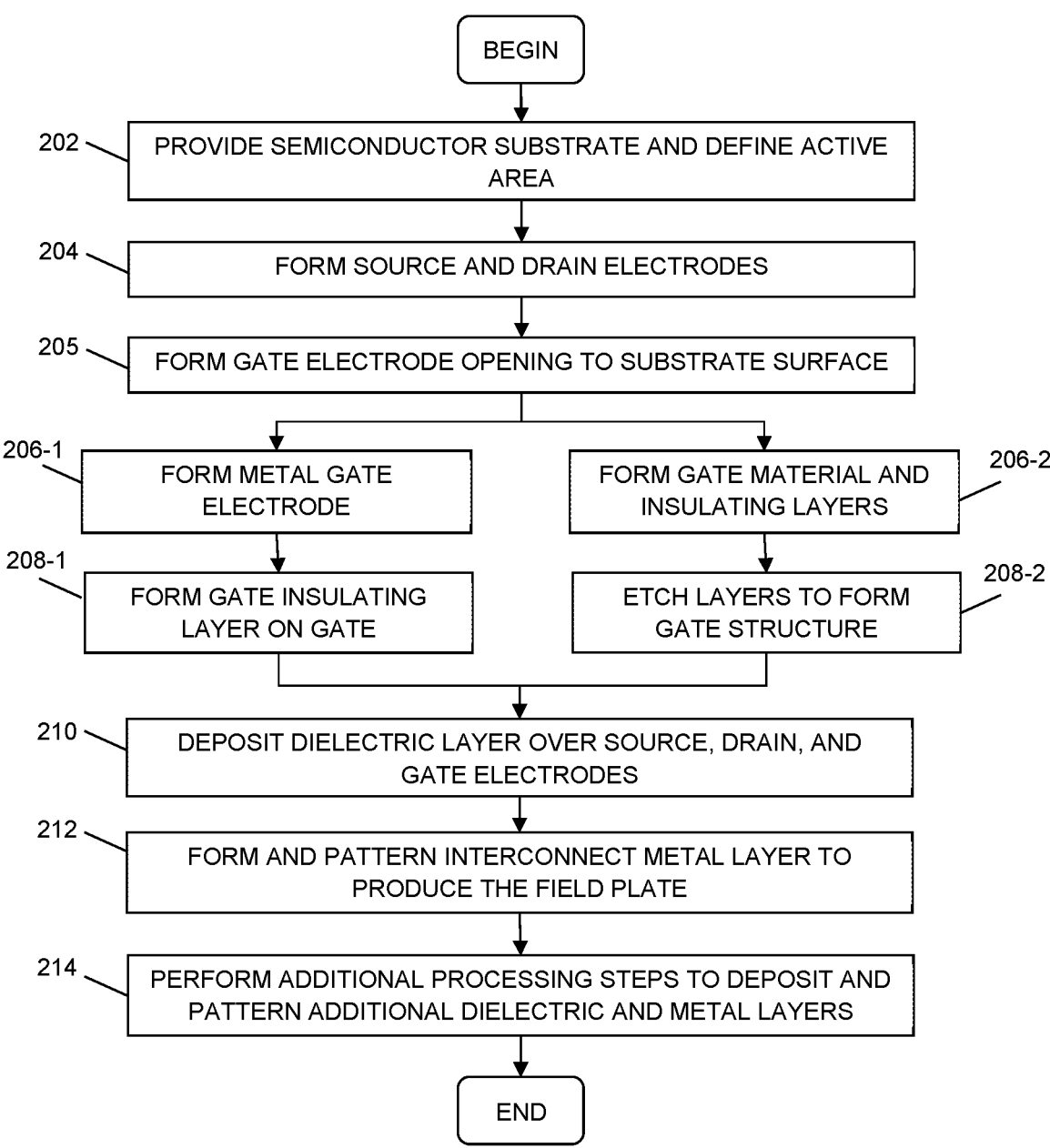
FIG. 2 is a process flow diagram describing a method for fabricating the device of FIG. 1 in accordance with an embodiment.

FIG. 2 is a process flow diagram depicting a method for fabricating the device of FIG. 1 in accordance with an embodiment. For enhanced understanding, FIG. 2 should be viewed simultaneously with FIGS. 3-8, which are cross sectional views depicting the device of FIG. 1 at various stages of fabrication in accordance with an embodiment.

Figure 3:
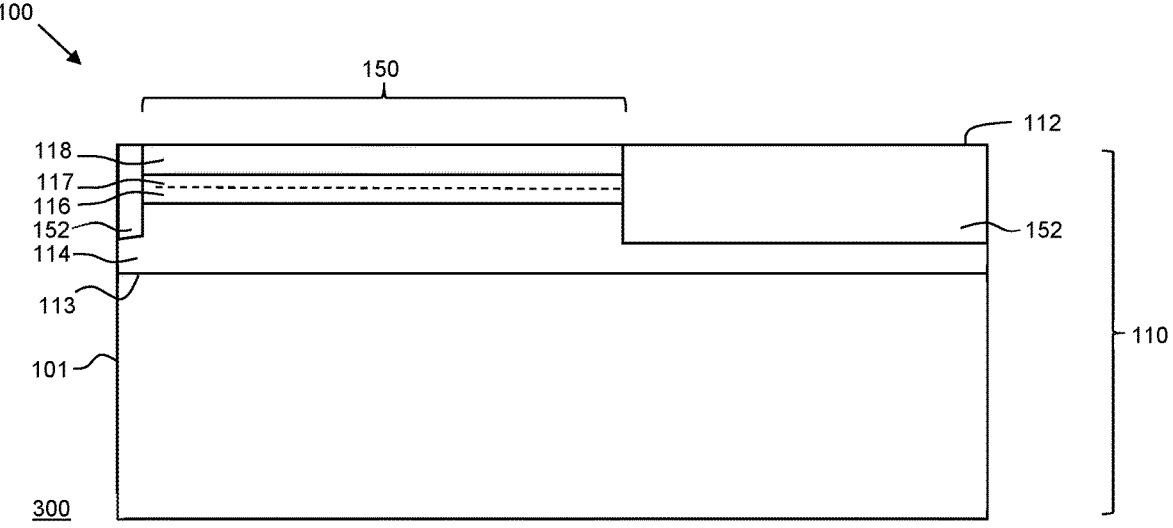
FIGS. 3, 4, 5A, 5B, 6A, 6B, 7, and 8 are cross sectional views depicting the device of FIG. 1 at various stages of fabrication in accordance with various embodiments.
Figure 4:
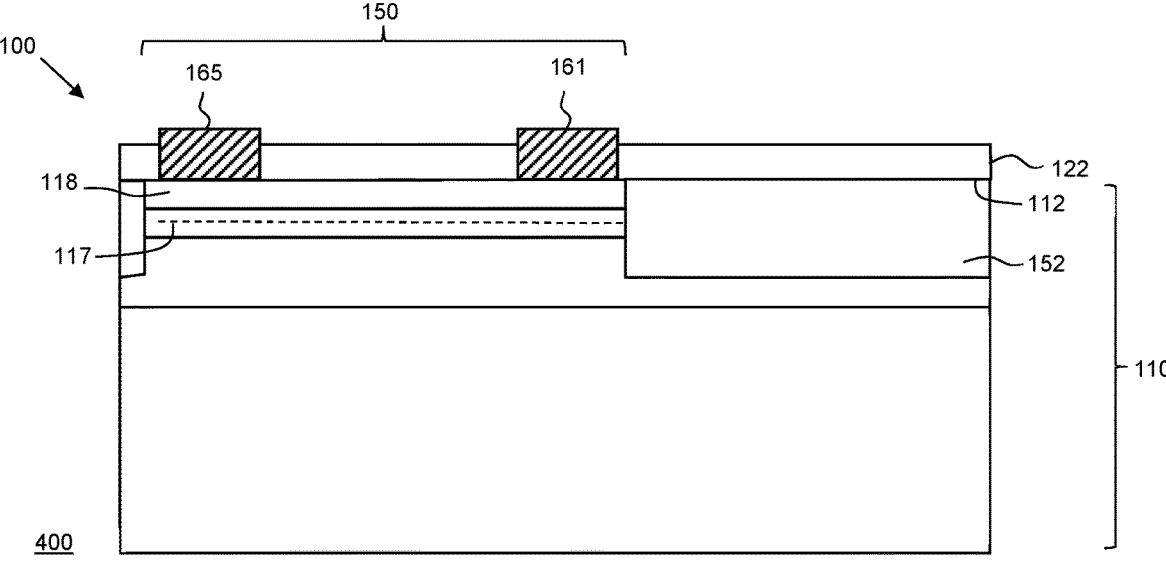

Referring first to step 202 and FIG. 3, at a first stage of fabrication 300, a semiconductor substrate 110 is provided, and an active area 150 is defined in the semiconductor substrate 110. As mentioned previously, the semiconductor substrate 110 may include a host semiconductor substrate 101 ("host substrate") and a plurality of layers overlying the host substrate 102. According to an embodiment, the plurality of layers overlying the host substrate 101 includes a buffer layer 114, a channel layer 116, and a barrier layer 118.

In an embodiment, the host substrate 101 includes an upper surface 113 and may be formed from silicon carbide (SiC). In other embodiments, the host substrate 101 may include other materials such as sapphire, silicon (Si), gallium nitride (GaN), aluminum nitride (AlN), diamond, boron nitride (BN), poly-SiC, silicon on insulator, gallium arsenide (GaAs), indium phosphide (InP), and other substantially insulating or high resistivity materials.

The buffer layer 114 may be formed on the upper surface 113 of host substrate 101. The buffer layer 114 may include one or more group III-N semiconductor layers. In some embodiments, the buffer layer 114 includes multiple layers of semiconductor material, wherein each of the layers of buffer layer 114 may include an epitaxially grown group-III nitride layer, for example. The epitaxially grown group-III nitride layers that make up buffer layer 114 may include nitrogen (N)-polar (i.e., N-face) or gallium (Ga)-polar (i.e., Ga-face) material, for example. In other embodiments, the semiconductor layer(s) of the buffer layer 114 may not be epitaxially grown. In still other embodiments, the semiconductor layer(s) of the buffer layer 114 may include Si, GaAs, InP, or other suitable materials.

The buffer layer 114 may include at least one AlGaN mixed crystal layer having a composition denoted by $Al_XGa_{1-X}N$ with an aluminum mole fraction, X, that can take on values between 0 and 1. The total thickness of buffer layer 114, including all of its constituent layers, may be between about 100 angstroms and about 100,000 angstroms although other thicknesses may be used. A limiting X value of 0 yields pure GaN while a value of 1 yields pure aluminum nitride (AlN). In an embodiment, the buffer layer 114 may include a nucleation region comprised of AlN. The nucleation region starts at the interface between the host substrate 101 and buffer layer 114, and extends about 100 angstroms to about 1000 angstroms into buffer layer 114. The buffer layer 114 may include additional $Al_XGa_{1-X}N$ layers formed over the nucleation region. The thickness of the additional $Al_XGa_{1-X}N$ layer(s) may be between about 100 angstroms and about 50,000 angstroms though other thicknesses may be used. In an embodiment, the additional $Al_XGa_{1-X}N$ layer(s) may be configured as GaN layer(s) (X=0) where the $Al_XGa_{1-X}N$ layer(s) are not intentionally doped (NID). Alternatively, the additional $Al_XGa_{1-X}N$ layer(s) may be configured as one or more GaN layers where the one or more GaN layers are intentionally doped with dopants that may include iron (Fe), chromium (Cr), carbon (C) or other suitable dopants that render buffer layer 114 substantially insulating or high resistivity. The dopant concentration may be between about $10^{17}$ cm$^{-3}$ and $10^{19}$ cm$^{-3}$ though other higher or lower concentrations may be used. The additional $Al_XGa_{1-X}N$ layers may be configured with X=0.01 to 0.10 where the $Al_XGa_{1-X}N$ is NID or, alternatively, where the $Al_XGa_{1-X}N$ is intentionally doped with Fe, Cr, C, a combination of these, or other suitable dopant species. In other embodiments, the additional layers may be configured as a superlattice where the additional layers include a series of alternating NID or doped $Al_XGa_{1-X}N$ layers where the value of X takes a value between 0 and 1. In still other embodiments, buffer layer 114 may include one or more indium gallium nitride (InGaN) layers, with composition denoted by $In_YGa_{1-Y}N$, where Y, the indium mole fraction, may take a value between 0 and 1. The thickness of the InGaN layer(s) may be between about 10 angstroms and about 1000 angstroms though other thicknesses may be used.

In an embodiment, the channel layer 116 may be formed over buffer layer 114. The channel layer 116 may include one or more group III-N semiconductor layers. The channel layer 116 may include an $Al_XGa_{1-X}N$ layer where X takes on values between 0 and 1. In an embodiment, the channel layer 116 is configured as GaN (X=0) although other values of X may be used without departing from the scope of the inventive subject matter. The thickness of the channel layer 116 may be between about 50 angstroms and about 10,000 angstroms, though other thicknesses may be used. The channel layer 116 may be NID or, alternatively, may include Si, Ge, C, Fe, Cr, or other suitable dopants. The dopant concentration may be between about $10^{16}$ and about $10^{19}$ cm$^{-3}$ though other higher or lower concentrations may be used. In other embodiments, channel layer 116 may include NID or doped $In_YGa_{1-Y}N$, where Y, the indium mole fraction, may take a value between 0 and 1.

The barrier layer 118 may be formed over the channel layer 116, in accordance with an embodiment. The barrier layer 118 may include one or more group III-N semiconductor layers. The barrier layer 118 may have a larger bandgap and/or larger spontaneous polarization than the channel layer 116 and, when the barrier layer 118 is over channel layer 116, the channel 117 may be created in the form of a two dimensional electron gas (2-DEG) within channel layer 116 adjacent the interface between the channel layer 116 and the barrier layer 118. In addition, tensile strain between the barrier layer 118 and channel layer 116 may cause additional piezoelectric charge to be introduced into the 2-DEG and the channel 117. The barrier layer 118 may include a multi-layer structure, where the first layer of the barrier layer 118 may include at least one NID $Al_XGa_{1-X}N$ layer where X takes on values between 0 and 1. In some embodiments, X may take a value of 0.1 to 0.35, although other values of X may be used. The thickness of the first layer of the barrier layer 118 may be between about 50 angstroms and about 1000 angstroms though other thicknesses may be used. The barrier layer 118 may be NID or, alternatively, may include Si, Ge, C, Fe, Cr, or other suitable dopants. The dopant concentration may be between about $10^{16}$ and $10^{19}$ cm$^{-3}$ though other higher or lower concentrations may be used.

There may be an additional AlN interbarrier layer (not shown) formed between the channel layer 116 and the barrier layer 118, in some embodiments. The AlN interbarrier layer may introduce additional spontaneous and piezoelectric polarization, increasing the channel charge and improving the electron confinement of the resultant 2-DEG that forms the channel 117.

In other embodiments, the barrier layer 118 may include one or more indium aluminum nitride (InAlN) layers, denoted $In_YAl_{1-Y}N$, where Y, the indium mole fraction, may take a value between about 0.1 and about 0.2 though other values of Y may be used. In the case of using InAlN to form the barrier layer 118, the thickness of the barrier layer 118 may be between about 50 angstroms and about 1000 angstroms though other thicknesses may be used. In the case of using InAlN to form the barrier layer 118, the InAlN may be NID or, alternatively, may include Si, Ge, C, Fe, Cr, or other suitable dopants. The dopant concentration may be between about $10^{16}$ cm$^{-3}$ and about $10^{19}$ cm$^{-3}$ though other higher or lower concentrations may be used.

A cap layer (not shown) may be formed over the barrier layer 118. When included, the cap layer presents a stable surface for the substrate 110 and serves to protect the upper surface 112 from chemical and environmental exposure incidental to wafer processing. The cap layer may include one or more group III-N semiconductor layers and is supported by barrier layer 118. In an embodiment, the cap layer includes GaN. The thickness of the cap layer may be between about 5 angstroms and about 100 angstroms though other thicknesses may be used. The cap layer may be NID or, alternatively, may include Si, Ge, C, Fe, Cr, or other suitable dopants. The dopant concentration may be between about $10^{16}$ cm$^{-3}$ and $10^{19}$ cm$^{-3}$ though other higher or lower concentrations may be used.

The isolation regions 152 may be formed via an implantation procedure configured to damage the epitaxial and/or other semiconductor layers to create high resistivity regions of the substrate 110, rendering the substrate 110 high resistivity or semi-insulating in the high resistivity regions while leaving the crystal structure intact in the active region 150. In other embodiments (not shown), one or more isolation regions 152 may be formed by removing one or more of the epitaxial and/or other semiconductor layers of the substrate 110 in areas corresponding to the isolation region(s) 152, and leaving behind active region "mesas" surrounded by high resistivity or semi-insulating isolation regions 152.

The transistor structure 151 (FIG. 1) may then be formed within the active region 150. Referring next to step 204 and FIG. 4, during a next stage of fabrication 400, conductive source and drain electrodes 161, 165 (e.g., ohmic contacts) are formed in the active region 150 of the device 100. More specifically, the first dielectric layer 124 is formed over the upper surface 112 of the semiconductor substrate 110, and openings corresponding to the locations of the source and drain electrodes 161, 165 are formed through the first dielectric layer 124. The source and drain electrodes 161, 165 are then formed in the openings. As discussed previously, the source and drain electrodes 161, 165 contact the upper surface 112 of the substrate 110 over opposite ends of the channel 117, and the source and drain electrodes 161, 165 may be electrically coupled to the channel 117 through the upper substrate surface 112 and the barrier layer 118. In other embodiments, the source and drain electrodes 161, 165 may be recessed through the upper substrate surface 112 and extend partially into or completely through the barrier layer 118, increasing the electrical coupling of the source and drain electrodes 161, 165 to the channel 117 through the barrier layer 118. In still other embodiments, ohmic contact regions may be formed by implanting a dopant species (e.g. Si) into the substrate 110. In some embodiments, low work function or other suitable materials may be combined with highly conductive materials in a metal stack to form the source and drain electrodes 161, 165, resulting in relatively low resistance contacts to the channel 117. Accordingly, a multi-stack metal layer (e.g. Ti, Al and or other suitable materials) may be deposited and annealed to form the source and drain electrodes 161, 165. It should be noted that, although FIG. 2 depicts the source and drain electrodes 161, 165 as being formed before the formation of gate structure 170 (described below), in an alternate embodiment, the source and drain electrodes 161, 165 may be formed after gate structure 170 (i.e., step 204 may be performed before or after steps 206-1/208-1 or 206-2-208-2).

In preparation for forming the gate structure, and referring next to step 205, an opening is formed through dielectric layer 122 between the source and drain electrodes 161, 163. To form the opening for the gate structure, a photoresist layer (not illustrated) is applied over dielectric layer 122 and the source and drain electrodes 161, 165, and the photoresist layer is patterned to include an opening (not illustrated) over the portion of layer 122 through which the subsequently-formed gate electrode 171 will make contact with the barrier layer 118. An etching process may then be performed through the opening in the photoresist mask to form a corresponding gate opening through layer 122. The photoresist mask is then removed.

The gate structure 170, including a metal gate electrode (e.g., gate electrode 171) and a gate insulating layer (e.g., layer 172), is then formed using either an additive or a subtractive semiconductor process. The additive semiconductor process is illustrated in FIGS. 5A and 5B and described below in conjunction with steps 206-1 and 208-1 (FIG. 2), and the alternate subtractive semiconductor process is illustrated in FIGS. 6A and 6B and described below in conjunction with steps 206-2 and 208-2 (FIG. 2).

Figure 5A:
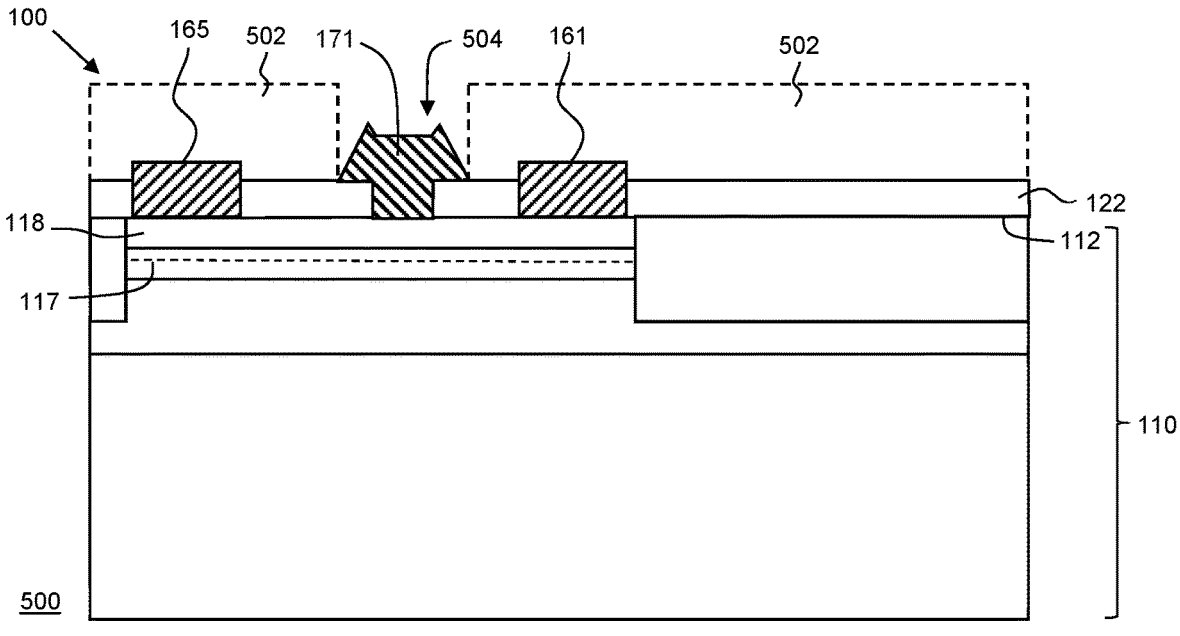
Figure 6A:
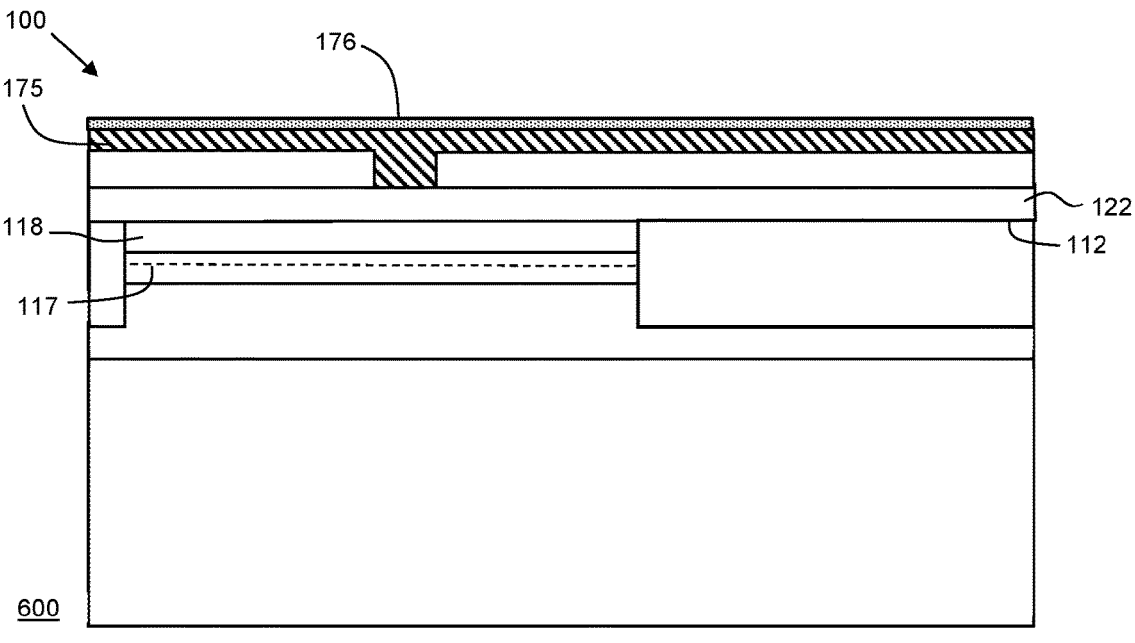
Figure 6B:
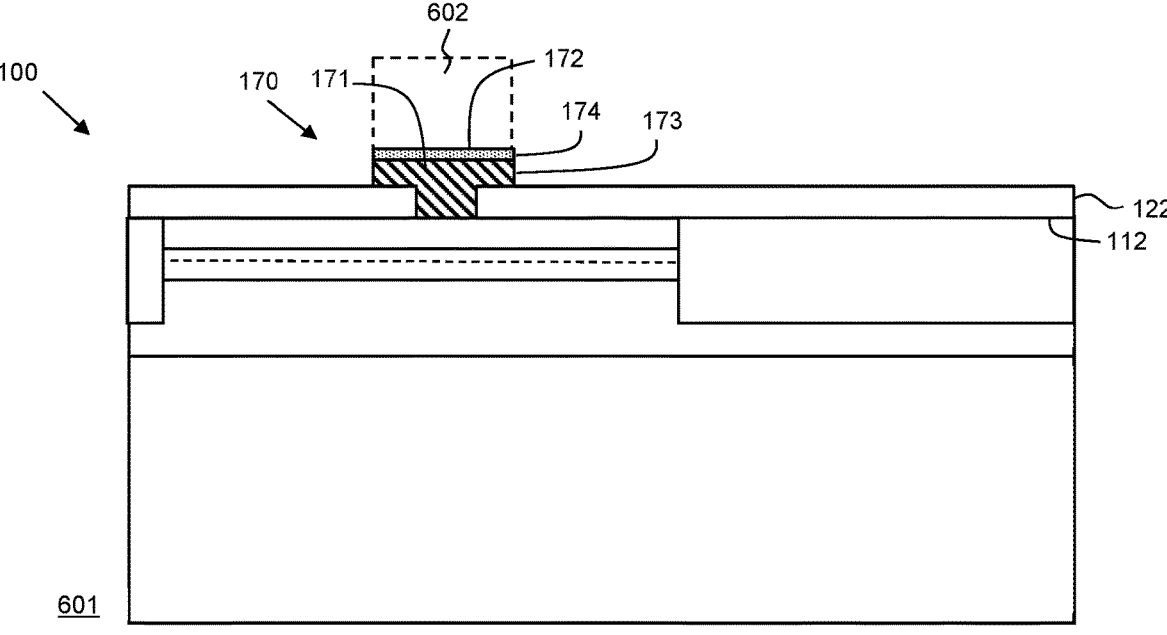

For the additive semiconductor process, and referring next to step 206-1 and FIG. 5A, during a next stage of fabrication 500, a photoresist layer is applied over dielectric layer 122 and the source and drain electrodes 161, 165. The photoresist layer is then patterned to produce a photoresist mask 502 with an opening 504 over the gate opening through layer 122 that was formed in step 205. The opening 504 in mask 502 is slightly wider than the previously-formed gate opening in layer 122 to prepare for formation of a T-shaped gate structure.

Figure 5B:
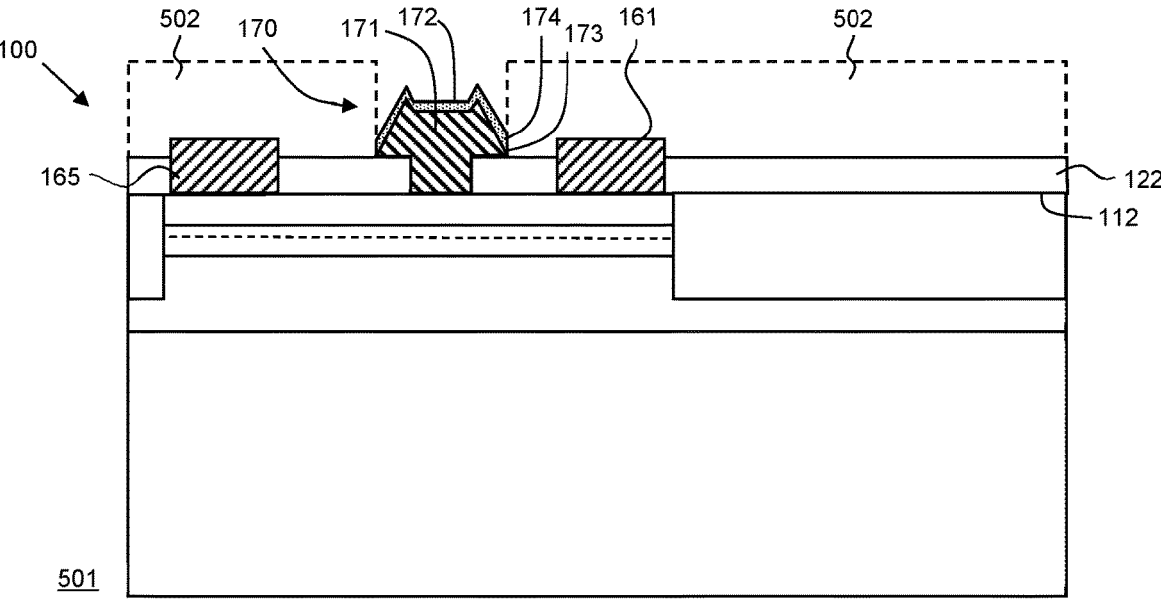

As shown in FIG. 5A, the gate electrode 171 (e.g., "control electrode") may then be formed by depositing a metal layer over the mask 502 and into the opening 504 (note that portions of the metal layer over mask 502 are not shown in FIGS. 5A and 5B). In an embodiment, the gate electrode 171 may be configured as a Schottky gate and may be formed over and directly in contact with the upper substrate surface 112 of the substrate 110 by sequentially depositing (e.g., using evaporation or other suitable deposition processes) a Schottky material layer and one or more conductive metal layers through the opening 504 in the photoresist mask 502. More specifically, Schottky or other suitable materials may be combined with highly conductive materials in a metal stack to form gate electrode 171, according to an embodiment. For example, a Schottky material layer may first be formed in contact with the substrate 110 through opening 504, and a conductive low-stress metal may be deposited over the Schottky material layer through opening 504 to form the gate electrode 171, according to an embodiment.

As will be described in conjunction with FIG. 5B, in some embodiments, the metal used to form the bulk of the gate electrode 171 (or at least the uppermost layer used to form the gate electrode 171) may include a metal or semiconductor that is suitable to be rendered insulating (e.g., through a subsequent oxidation and/or nitridation process). For example, materials that are suitable to be rendered insulating, and thus that may be used to form the bulk of the gate electrode 171 or its uppermost layer, may include titanium, aluminum, boron, silicon or another suitable material, in various embodiments. In still other embodiments, the gate electrode 171 may be formed over a gate dielectric or gate oxide (not illustrated) on the surface 112 of the substrate 110, thus forming a metal-insulator-semiconductor (MIS) junction or metal oxide semiconductor (MOS) junction, which is electrically coupled to the channel 117 through the gate dielectric or gate oxide layer.

The gate electrode 171 may have a T-shaped cross section, as shown in FIG. 5A, with a vertical stem over substrate 110 that passes through the first dielectric layer 122, and a wider portion over the vertical stem and in contact with the upper surface of the first dielectric layer 122, according to an embodiment. In some embodiments, the gate electrode 171 directly contacts the top surface 112 of the substrate 110. In other embodiments, the gate electrode 171 may be recessed through the upper substrate surface 112 and may extend partially into the barrier layer 118, increasing the electrical coupling of gate electrode 171 to channel 117 through the barrier layer 118.

Referring next to step 208-1 and FIG. 5B, during a next stage of fabrication 501, an insulating material layer 172 that defines the upper surface of the gate structure 170 may either be formed through an oxidation and/or nitridation process or may be deposited over the top of the gate electrode 171, according to various embodiments.

More specifically, according to one embodiment, the top portion of the gate electrode 171 may be rendered insulating through a processing step, which results in the creation of the insulating layer 172. Accordingly, the insulating layer 172 may be referred to as a "processed layer" (as opposed to a deposited layer). For example, during the previous fabrication stage 500 (FIG. 5A), and as mentioned above, either the bulk of the gate electrode 171 or a final layer deposited through mask opening 504 to define the exposed surface of the gate electrode 171 may include a conductive or semiconductor material that is suitable to be rendered insulating through oxidation, nitridation, and/or another process. An oxidation and/or nitridation process then may be performed to produce insulating material layer 172.

The oxidation and/or nitridation process essentially causes the exposed top portion of the gate electrode 171 to oxidize or become nitridated, thus being rendered insulating. According to an embodiment, for example, an oxidation process may include exposing the device 100, and in particular the bare surface of the gate electrode 171 (FIG. 5A), to an oxygen-containing environment either before or after removal of photoresist mask 502. For example, an oxidation process may be performed in which a wafer containing the device 100 is loaded into a chamber and exposed to an oxygen plasma (e.g., at 0.1 Torr, 300 watts, and 300 degrees Celsius). The oxidation process may be performed for a period of time (e.g., 10 minutes) that is suitable to render the exposed surface of the gate electrode 171 insulating (i.e., to create an insulating layer 172 at the surface of the gate electrode 171). When the material exposed at the surface of gate electrode 171 is titanium, aluminum, boron, or silicon, for example, an oxidation process results in the formation of a layer of titanium oxide, aluminum oxide, boron oxide, boron oxynitride, silicon oxide (e.g., monoxide, dioxide, or a combination), or silicon oxynitride, respectively, as the insulating material layer 172. According to an embodiment, upon completion of step 208-1, the thickness of the "rendered" insulating material layer 172 is in a range of about 500 angstroms to about 5000 angstroms, although the rendered insulating material layer 172 may be thinner or thicker, as well.

In an alternate embodiment, in step 208-1, an insulating material layer 172 is deposited on the gate electrode 171, rather than forming layer 172 through an oxidation or nitridation process. For example, using the same patterned photoresist mask 502, the insulating material layer 172 may be deposited through opening 504 using evaporation or another suitable process. According to various embodiments, the "deposited" insulating material layer 172 may include a layer of silicon dioxide, silicon nitride, silicon monoxide, boron oxide, boron nitride, and/or another suitable insulating material. According to an embodiment, the thickness of the deposited insulating material layer 172 is in a range of about 1000 angstroms to about 10,000 angstroms, although layer 172 may be thinner or thicker, as well. After depositing layer 172, the photoresist mask 502 may then be removed.

FIGS. 5A and 5B depict an additive process for forming gate structure 170. According to another embodiment, when a subtractive semiconductor process is used to form the gate structure 170 (rather than the above-described additive process), the step 204 of forming the source and drain electrodes 161, 165 may be performed after forming the gate structure 170, rather than before. Accordingly, in FIGS. 6A and 6B, the source and drain electrodes 161, 165 are not shown.

For the subtractive semiconductor process, and referring next to step 206-2 and FIG. 6A, during a next stage of fabrication 600, one or more conductive gate material layers 175 (referred to collectively as "metal layer" 175) are blanket deposited over the surface of dielectric layer 122, including into the opening formed through dielectric layer 122 in step 205. When the gate electrode 171 is to be configured as a Schottky gate, deposition of metal layer 175 includes depositing a Schottky material layer and one or more conductive metal layers on the surface of dielectric layer 122. More specifically, Schottky or other suitable materials may be combined with highly conductive materials (e.g., conductive low-stress metal) in a metal stack to form metal layer 175, according to an embodiment. In some embodiments, the metal used to form the bulk of metal layer 175 (or at least the uppermost metal layer used to form metal layer 175) may include a material that is suitable to be rendered insulating (e.g., through a subsequent oxidation and/or nitridation process). For example, materials that are suitable to be rendered insulating, and thus that may be used to form the bulk of metal layer 175 or its uppermost layer, may include titanium, aluminum, boron, silicon, or another suitable metal, in various embodiments. In still other embodiments, metal layer 175 may be formed over a gate dielectric or gate oxide (not illustrated) on the surface 112 of the substrate 110, thus forming a MIS junction or MOS junction, which is electrically coupled to the channel 117 through the gate dielectric or gate oxide layer.

Referring still to FIG. 6A, an insulating material layer 176 then may either be formed through an oxidation and/or nitridation process or may be deposited over the top of metal layer 175, according to various embodiments. More specifically, according to one embodiment, the top portion of metal layer 175 may be rendered insulating through a processing step, which results in the creation of the insulating layer 176. Accordingly, the insulating layer 176 may be referred to as a "processed layer" (as opposed to a deposited layer). For example, during fabrication stage 600, and as mentioned above, either the bulk of metal layer 175 or a final material layer deposited to define the exposed surface of metal layer 175 may include a conductive or semiconductor material that is suitable to be rendered insulating through oxidation, nitridation, and/or another process. An oxidation and/or nitridation process then may be performed to produce insulating material layer 176.

The oxidation and/or nitridation process essentially causes the exposed top portion of metal layer 175 to oxidize or become nitridated, thus being rendered insulating. According to an embodiment, for example, an oxidation process may include exposing the device 100, and in particular the bare surface of the metal layer 175 (FIG. 6A), to an oxygen-containing environment. For example, an oxidation process may be performed in which a wafer containing the device 100 is loaded into a chamber and exposed to an oxygen plasma (e.g., at 0.1 Torr, 300 watts, and 300 degrees Celsius). The oxidation process may be performed for a period of time (e.g., 10 minutes) that is suitable to render the exposed surface of the metal layer 175 insulating (i.e., to create an insulating layer 176 at the surface of metal layer 175). When the conductive material is titanium, aluminum, boron, or silicon, for example, an oxidation process results in the formation of a layer of titanium oxide, aluminum oxide, boron oxide, boron oxynitride, silicon oxide (monoxide, dioxide, or a combination), or silicon oxynitride, respectively, as the insulating material layer 176. According to an embodiment, upon completion of step 208-2, the thickness of the "rendered" insulating material layer 176 is in a range of about 500 angstroms to about 5000 angstroms, although the rendered insulating material layer 176 may be thinner or thicker, as well.

In an alternate embodiment, in step 206-2, an insulating material layer 176 is deposited over the metal layer 175, rather than forming layer 176 through an oxidation or nitridation process. For example, the insulating material layer 176 may be blanket deposited onto the surface of metal layer 175 using evaporation or another suitable process. According to various embodiments, the "deposited" insulating material layer 176 may include a layer of silicon dioxide, silicon nitride, silicon monoxide, boron oxide, boron nitride, and/or another suitable insulating material. According to an embodiment, the thickness of the deposited insulating material layer 176 is in a range of about 1000 angstroms to about 10,000 angstroms, although layer 176 may be thinner or thicker, as well.

Referring next to step 208-2 and FIG. 6B, during a next stage of fabrication 601, a photoresist layer is applied to the top surface of layer 176, and the photoresist layer is patterned to produce a photoresist mask 602 that includes portions overlying the to-be-formed gate structure 170. In other words, the photoresist mask 602 protects the underlying materials of the to-be-formed gate structure 170, and defines the lateral extent or pattern of the gate structure 170. A selective etching process is then performed to remove all portions of layers 175 and 176, except for those portions underlying the photoresist mask 602. The etching process results in a gate structure 170 that includes a T-shaped gate electrode 171 and an overlying insulating material 172. The photoresist mask 602 may then be removed.

Both of the additive and subtractive process embodiments described above result in a gate structure 170, which includes an insulating material layer 172 that is located only over the gate electrode 171, and which does not extend over the top surface of dielectric layer 122. In other words, and because the gate electrode 171 and the insulating material layer 172 may be formed or deposited using a same photoresist mask (e.g., mask 502 or 602), the lateral extents or edges 174 of the gate insulating layer 172 correspond to the lateral extents or edges 173 of the metal gate electrode 171, where "correspond to," in this context, means "are substantially the same as". In other words, the gate electrode 171 and the insulating material layer 172 may have a same pattern and a same lateral extent. In some cases, when the gate insulating layer 172 is formed using an oxidation or nitridation process, the lateral extent of the insulating material layer 172 may grow to be slightly wider than the underlying gate electrode 171. In other cases, when the gate insulating layer 172 is etched at the same time as etching the gate electrode 171, the insulating material layer 172 may be etched to be slightly narrower than the underlying gate electrode 171. Either way, the lateral extent (or edges 173) of the gate insulating layer 172 are still considered to correspond to the lateral extent (or edges 174) of the gate electrode 171.

Further, it may be noted here that the insulating material layer 172 is formed or deposited in a distinct and separate process from the process used subsequently to deposit dielectric layer 124. In other words, the insulating material layer 172 is a distinct layer from the subsequently-deposited dielectric layer 124. Further, insulating material layer 172 may be formed from a same dielectric material as dielectric layers 122, 124, and/or 126 or insulating material layer 172 may be formed from a different dielectric material from dielectric layers 122, 124, and/or 126. For example, in specific embodiments in which dielectric layers 122, 124, 126 are formed from different materials from insulating material layer 172, dielectric layers 122, 124, and 126 may be formed from silicon nitride or silicon oxynitride, and insulating material layer 172 may be formed from silicon dioxide, silicon monoxide, titanium oxide, aluminum oxide, boron nitride, boron oxide, or boron oxynitride.

However it is formed, the gate electrode 171 is electrically coupled to the channel 117 through the upper substrate surface 112 and the barrier layer 118. Changes to the electric potential on gate electrode 171 may shift the quasi Fermi level for the barrier layer 118 compared to the quasi Fermi level for the channel layer 116 and thereby modulate the electron concentration in the channel 117 within the portion of the substrate 110 under the gate electrode 171.

Figure 7:
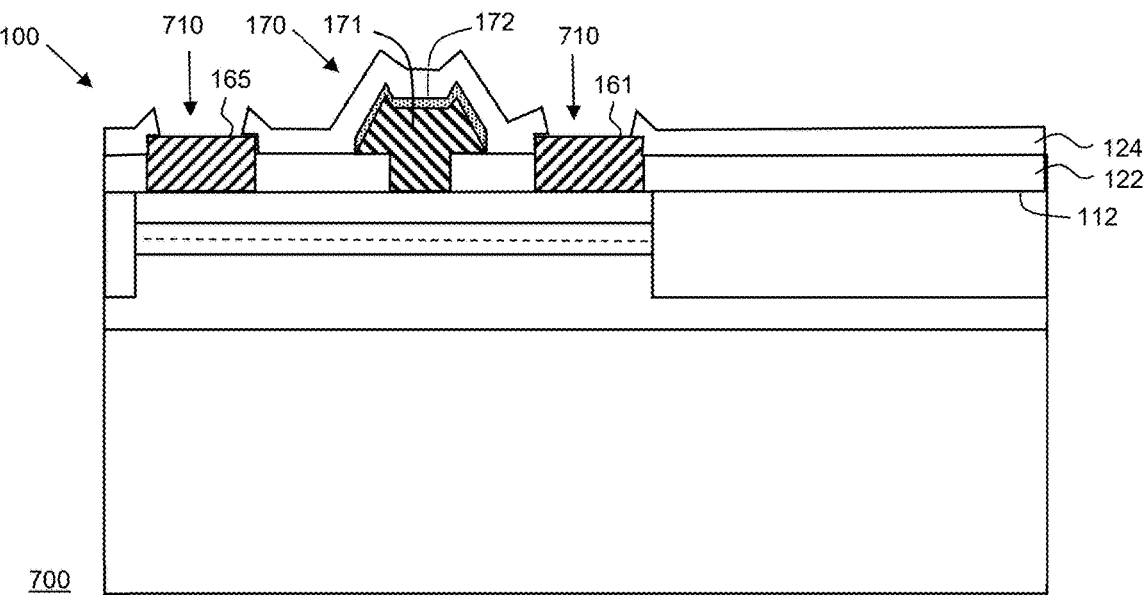

Referring next to step 210 and FIG. 7, during a next stage of fabrication 700, a second dielectric layer 124 is deposited over the first dielectric layer 122, the source and drain electrodes 161, 165, and the gate structure 170. Openings 710 are then formed in the second dielectric layer 124 to expose the top surfaces of the source and drain electrodes 161, 165. Additional openings (not illustrated) also are formed in the second dielectric layer 124 and through the insulating material layer 172 of the gate structure 170 to expose portions of the top surface of the gate electrode 171.

Figure 8:
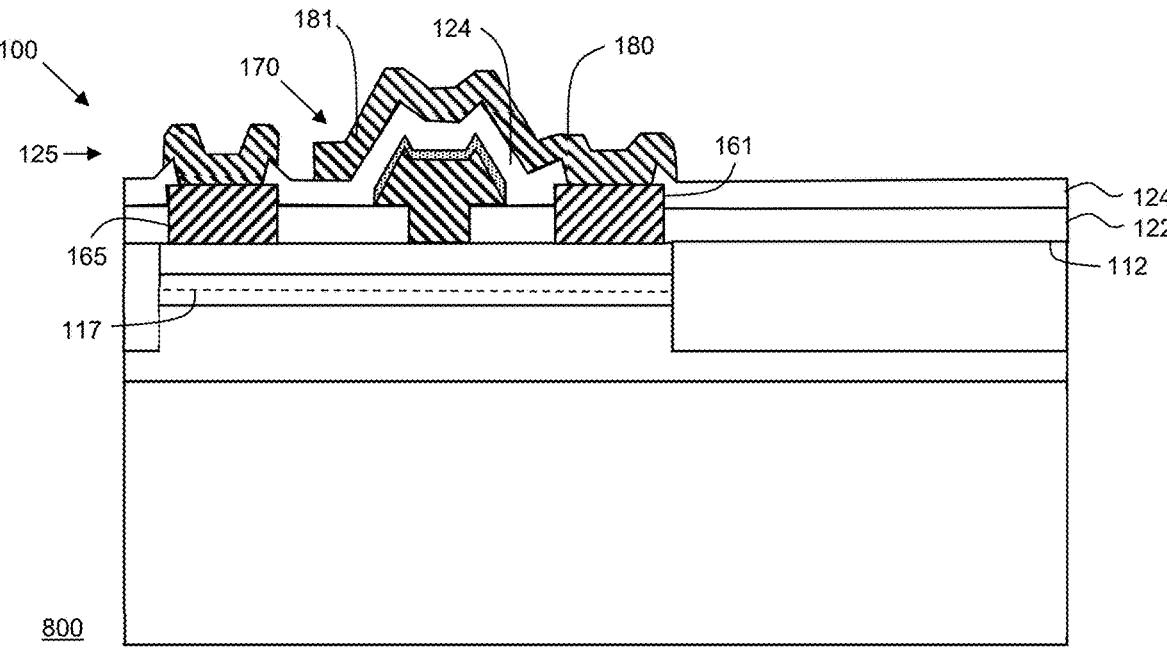

Referring next to step 212 and FIG. 8, during a next stage of fabrication 800, a first interconnect metal layer 125 is deposited over the second dielectric layer 124. The first interconnect metal layer 125 is then patterned so that portions of the patterned first interconnect metal layer 125 contact each of the source electrode 161, the drain electrode 165, and the gate structure 170 through the openings (e.g., openings 710, FIG. 7) in the second dielectric layer 124.

One of those portions 180 of the first interconnect metal layer 125 contacts the source electrode 161 and extends between the source electrode 161 and the gate structure 170. Portions or "straps" of the first interconnect metal layer 125 extend over the gate structure 170 to contact a field plate 181 at the drain-side of the gate structure 170. The field plate 181 is electrically coupled to the source electrode 161 through the "strap" portion of the first interconnect metal layer 125, in an embodiment. In other embodiments, the field plate 181 may be electrically coupled to the gate electrode 171 (embodiment not shown).

The first interconnect metal layer 125 may include an adhesion layer and a conductive layer in contact with the adhesion layer. The adhesion layer may be selected from one or more of Ti, TiW, Cr, or other suitable low-stress material (s). The adhesion layer may have a thickness between about 50 angstroms and about 10,000 angstroms, although other thicknesses may be used. The conductive layer may be selected from one or more of Au, Al, Ag, or Cu. The conductive layer may have a thickness of between about 0.1 and about 10 microns though other thicknesses may be used.

Referring next to step 214, additional fabrication steps are performed, which result in the embodiment of device 100 shown in FIG. 1. More specifically, and referring again to FIG. 1, the additional fabrication steps include depositing a third dielectric layer 126 over the first interconnect metal layer 125. The third dielectric layer 126 is then patterned to form openings (not numbered) in the third dielectric layer 126 that expose those portions of the first interconnect metal layer 125 that contact the source and drain electrodes 161, 165. Additional openings (not illustrated) also are formed in the third dielectric layer 126 to facilitate electrical connection to the gate structure 170.

A second interconnect metal layer 127 is then deposited over the third dielectric layer 126. The second interconnect metal layer 127 may include an adhesion layer and a conductive layer in contact with the adhesion layer, in some embodiments. The second interconnect metal layer 127 is then patterned so that separate portions of the second interconnect metal layer 127 are electrically coupled to each of the source electrode 161, the drain electrode 165, and the gate structure 170 through the openings in the third dielectric layer 126.

One of those portions 162 of the second interconnect metal layer 127 is electrically coupled to and extends from the source electrode 161 to the portion of the upper surface 112 of the substrate 110 over the isolation region 152. The backside of the substrate 110 is then thinned to produce the lower surface 111, and TSV 140 is created by forming an opening that extends from the lower surface 111 of the substrate 110 up to the upper surface 112 of the substrate 110, terminating at the upper surface 112 and exposing the portion of the second interconnect metal layer 127 present over the isolation region 152. The back metal layer 144 is then deposited over the lower surface 111 and into the TSV 140, resulting in a physical and electrical connection at the innermost end of the TSV 140 between the back metal layer 144 and the portion of the second interconnect metal layer 127 that is coupled to the source electrode 161. Accordingly, the source electrode 161 and the field plate 181 are electrically coupled to the back metal layer 144.

Capacitive coupling between the field plate 181 and the channel 117 is a desired characteristic of device 100, but parasitic capacitance between the field plate 181 and the gate electrode 171 (or the gate-to-source capacitance $C_{GS}$) is not desirable. Embodiments of the inventive subject matter provide a way to increase the dielectric thickness between the gate electrode 171 and the field plate 181 without increasing the dielectric thickness between the field plate 181 and the channel 117 in the semiconductor substrate 110. In a typical device, the same dielectric layers that are present between the field plate and the gate electrode are also present between the field plate and the semiconductor substrate surface. By including the gate insulating layer 172 only between the gate electrode 171 and the field plate 181 (but not between the field plate 181 and the channel 117), the insulating material layer 172 has the effect of increasing the dielectric material thickness between the gate electrode 171 and the field plate 181 (and thus reducing parasitic $C_{GS}$) without increasing the thickness of the dielectric layers 122, 124 between the field plate 181 and the surface 112 of the semiconductor substrate 110 (and thus maintaining the capacitive coupling between the field plate 181 and the channel 117). This may have the effect of reducing the parasitic capacitance between gate electrode 171 and field plate 181 by at least 5 percent, when compared with the parasitic capacitance between a gate electrode and a field plate in a device that lacks the insulating material layer 172 but is identical in all other respects. In other embodiments, inclusion of the insulating material layer 172 may result in a reduction in parasitic capacitance of at least 10 percent, when compared with another otherwise identical device (i.e., an identical device that lacks the insulating material layer 172).

An embodiment of a transistor device includes a semiconductor substrate and a gate structure formed at the upper surface of the substrate. The gate structure includes a metal gate electrode and a gate insulating layer overlying the metal gate electrode, where edges of the gate insulating layer correspond to edges of the metal gate electrode. The transistor device also includes a first dielectric layer formed over the gate structure, and a first interconnect metal layer formed over the first dielectric layer. A portion of the first interconnect metal layer forms a field plate proximate to the gate structure, and a portion of the gate insulating layer and a portion of the first dielectric layer are present between the gate electrode and the field plate.

An embodiment of a field effect transistor includes a semiconductor substrate with an upper surface and a channel below the upper surface, source and drain electrodes formed at the upper surface of the substrate over the channel, and a gate structure formed at the upper surface of the substrate over the channel and between the source and drain electrodes. The gate structure includes a metal gate electrode and a gate insulating layer overlying the metal gate electrode, where edges of the gate insulating layer correspond to edges of the metal gate electrode. The FET further includes a first dielectric layer formed over the gate structure, and a first interconnect metal layer formed over the first dielectric layer. A portion of the first interconnect metal layer forms a field plate proximate to the gate structure, and a portion of the gate insulating layer and a portion of the first dielectric layer are present between the gate electrode and the field plate.

An embodiment of a method of fabricating a transistor device includes providing a substrate, and forming a gate structure at the upper surface of the substrate by forming a metal gate electrode at the upper surface of the substrate, and forming a gate insulating layer over the metal gate electrode, where edges of the gate insulating layer correspond to edges of the metal gate electrode. The method further includes depositing a first dielectric layer over the gate structure, and forming a first interconnect metal layer over the first dielectric layer. A portion of the first interconnect metal layer forms a field plate proximate to the gate structure, and a portion of the gate insulating layer and a portion of the first dielectric layer are present between the gate electrode and the field plate.

As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A transistor device comprising:
a semiconductor substrate that includes an upper surface;
a first dielectric layer formed on the upper surface of the semiconductor substrate;
a gate structure formed at the upper surface of the substrate, wherein the gate structure includes a metal gate electrode and a gate insulating layer overlying and in direct contact with the metal gate electrode, wherein the metal gate electrode is formed from a metal selected from a group consisting of titanium and aluminum, and wherein the metal gate electrode includes a vertical stem that extends through the first dielectric layer and a wider portion in contact with and extending above an upper surface of the first dielectric layer, wherein the gate insulating layer is formed from a dielectric material selected from a group consisting of titanium oxide and aluminum oxide, wherein the gate insulating layer is an oxidized portion of the bulk metal, and wherein edges of the gate insulating layer correspond to edges of the gate structure;
a second dielectric layer formed over the gate structure; and
a first interconnect metal layer formed over the second dielectric layer, wherein a portion of the first interconnect metal layer forms a field plate proximate to the gate structure, wherein a portion of the gate insulating layer and a portion of the second dielectric layer are present between the metal gate electrode and the field plate, and wherein the gate insulating layer covers an entire surface of the metal gate electrode between the metal gate electrode and the field plate.

2. The transistor device of claim 1, wherein the gate insulating layer and the second dielectric layer are distinct layers.

3. The transistor device of claim 2, wherein the gate insulating layer and the second dielectric layer are formed from different dielectric materials.

4. The transistor device of claim 1, wherein:
the gate insulating layer has a thickness in a range of 500 angstroms to 10,000 angstroms; and
the first dielectric layer has a thickness in a range of 100 angstroms to 10,000 angstroms.

5. The transistor device of claim 1, further comprising:
a first current-carrying electrode at the upper surface of the substrate proximate to a first side of the gate structure; and
a second current-carrying electrode at the upper surface of the substrate proximate to a second side of the gate structure.

6. The transistor device of claim 5, wherein the transistor device is a high electron mobility transistor.

7. The transistor device of claim 1, wherein:
the metal gate electrode is formed from titanium; and
the gate insulating layer is formed from titanium oxide.

8. The transistor device of claim 1, wherein:
the metal gate electrode is formed from aluminum; and
the gate insulating layer is formed from aluminum oxide.

9. A field effect transistor comprising:
a semiconductor substrate that includes an upper surface and a channel below the upper surface;
a source electrode formed at the upper surface of the substrate over the channel;
a drain electrode formed at the upper surface of the substrate over the channel;
a first dielectric layer formed on the upper surface of the semiconductor substrate;
a gate structure formed at the upper surface of the substrate, wherein the gate structure includes a metal gate electrode and a gate insulating layer overlying and in direct contact with the metal gate electrode, wherein the metal gate electrode is formed from a metal selected from a group consisting of titanium and aluminum, and wherein the metal gate electrode includes a vertical stem that extends through the first dielectric layer and a wider portion in contact with and extending above an upper surface of the first dielectric layer, wherein the gate insulating layer is formed from a dielectric material selected from a group consisting of titanium oxide and aluminum oxide, wherein the gate insulating layer is an oxidized portion of the bulk metal, and wherein edges of the gate insulating layer correspond to edges of the gate structure;
a second dielectric layer formed over the gate structure; and
a first interconnect metal layer formed over the second dielectric layer, wherein a portion of the first interconnect metal layer forms a field plate proximate to the gate structure, wherein a portion of the gate insulating layer and a portion of the second dielectric layer are present between the metal gate electrode and the field plate, and wherein the gate insulating layer covers an entire surface of the metal gate electrode between the metal gate electrode and the field plate.

10. The field effect transistor device of claim 9, wherein the gate insulating layer and the second dielectric layer are distinct layers.

11. The field effect transistor device of claim 9, wherein the field effect transistor is a high electron mobility transistor.

12. The field effect transistor device of claim 9, wherein:
the metal gate electrode is formed from titanium; and
the gate insulating layer is formed from titanium oxide.

13. The field effect transistor device of claim 9, wherein:
the metal gate electrode is formed from aluminum; and
the gate insulating layer is formed from aluminum oxide.

14. A method of fabricating a transistor device, the method comprising:
providing a substrate that includes an upper surface;
forming a first dielectric layer on the upper surface of the semiconductor substrate;
forming a gate structure at the upper surface of the substrate, wherein forming the gate structure includes forming a metal gate electrode at the upper surface of the substrate, wherein the metal gate electrode is formed from a metal selected from a group consisting of titanium and aluminum, and wherein the metal gate electrode includes a vertical stem that extends through the first dielectric layer and a wider portion in contact with and extending above an upper surface of the first dielectric layer, and oxidizing the bulk metal of the metal gate electrode to form a gate insulating layer over and in direct contact with the metal gate electrode, wherein the gate insulating layer is formed from a dielectric material selected from a group consisting of titanium oxide and aluminum oxide, and wherein edges of the gate insulating layer correspond to edges of the gate structure;

depositing a second dielectric layer over the gate structure; and forming a first interconnect metal layer over the second dielectric layer, wherein a portion of the first interconnect metal layer forms a field plate proximate to the gate structure, wherein a portion of the gate insulating layer and a portion of the second dielectric layer are present between the metal gate electrode and the field plate, and wherein the gate insulating layer covers an entire surface of the metal gate electrode between the metal gate electrode and the field plate.

15. The method of claim 14, wherein:

forming the metal gate electrode comprises forming the metal gate electrode from titanium as the bulk metal; and oxidizing the bulk metal to form the gate insulating layer comprises oxidizing the titanium to form the gate insulating layer as a titanium oxide layer.

16. The method of claim 14, wherein:

forming the metal gate electrode comprises forming the metal gate electrode from aluminum as the bulk metal; and oxidizing the bulk metal to form the gate insulating layer comprises oxidizing the aluminum to form the gate insulating layer as an aluminum oxide layer.

* * * * *